(12) United States Patent
Sun et al.

(10) Patent No.: US 9,768,230 B2
(45) Date of Patent: Sep. 19, 2017

(54) HIGH RECTIFYING RATIO DIODE

(71) Applicant: GLOBALFOUNDRIES Singapore Pte. Ltd., Singapore (SG)

(72) Inventors: Yuan Sun, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 481 days.

(21) Appl. No.: 14/084,633

(22) Filed: Nov. 20, 2013

(65) Prior Publication Data
US 2015/0137060 A1    May 21, 2015

(51) Int. Cl.
  *H01L 47/00*    (2006.01)
  *H01L 27/24*    (2006.01)
  *H01L 29/872*   (2006.01)
  *H01L 45/00*    (2006.01)
  *H01L 29/66*    (2006.01)

(52) U.S. Cl.
  CPC ...... *H01L 27/2409* (2013.01); *H01L 27/2463* (2013.01); *H01L 29/66143* (2013.01); *H01L 29/872* (2013.01); *H01L 45/04* (2013.01); *H01L 45/06* (2013.01); *H01L 45/1233* (2013.01); *H01L 45/146* (2013.01); *H01L 45/16* (2013.01)

(58) Field of Classification Search
  CPC ........... H01L 27/2409; H01L 29/66143; H01L 29/872; H01L 45/04; H01L 45/1233; H01L 45/146; H01L 45/16
  See application file for complete search history.

(56) References Cited

U.S. PATENT DOCUMENTS

| | | | | |
|---|---|---|---|---|
| 2003/0062585 A1* | 4/2003 | Andoh | ............... | H01L 27/0814 257/471 |
| 2006/0125040 A1* | 6/2006 | Levin | ............... | H01L 27/0629 257/471 |
| 2009/0161406 A1* | 6/2009 | Chuang | ............... | H01L 27/24 365/148 |
| 2011/0233502 A1* | 9/2011 | Shigeoka | ............ | H01L 27/2409 257/2 |
| 2012/0009771 A1* | 1/2012 | Cabral, Jr. | ........ | H01L 21/28512 438/581 |
| 2012/0043517 A1* | 2/2012 | Sonehara | ............ | H01L 27/2409 257/2 |
| 2014/0183434 A1* | 7/2014 | Lim | .................... | H01L 27/2463 257/4 |
| 2014/0209846 A1* | 7/2014 | Okajima | ............ | H01L 27/2409 257/2 |
| 2014/0225053 A1* | 8/2014 | Fujii | ...................... | H01L 45/08 257/2 |

* cited by examiner

Primary Examiner — Allen Parker
Assistant Examiner — Frederick B Hargrove
(74) Attorney, Agent, or Firm — Horizon IP Pte Ltd.

(57) ABSTRACT

Devices and methods for forming a device are disclosed. The device includes a substrate and a selector diode disposed over the substrate. The diode includes first and second terminals. The first terminal is disposed between the second terminal and the substrate. The diode includes a Schottky Barrier (SB) disposed at about an interface of the first and second terminals. The SB includes a tunable SB height defined by a SB region having segregated dopants. The device includes a memory element disposed over and coupled to the selector diode.

22 Claims, 11 Drawing Sheets

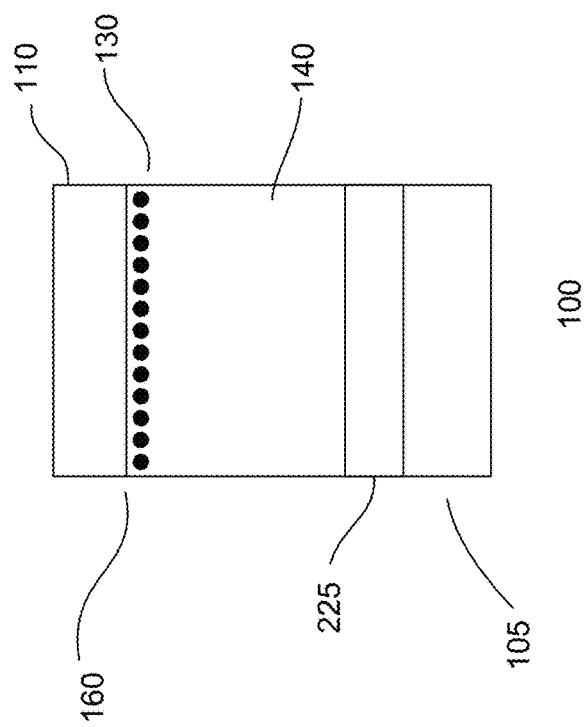
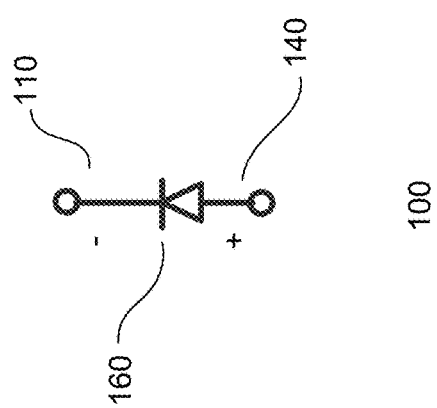

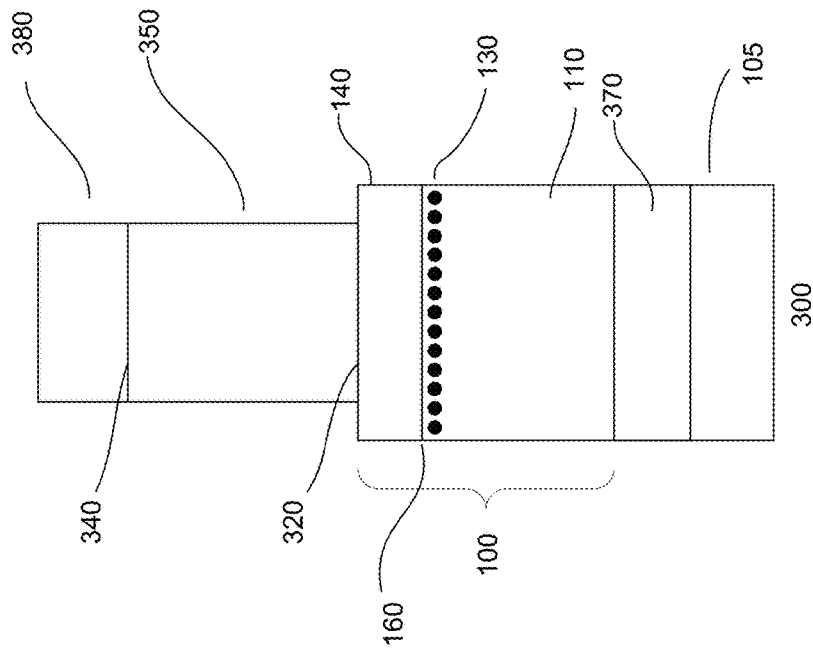
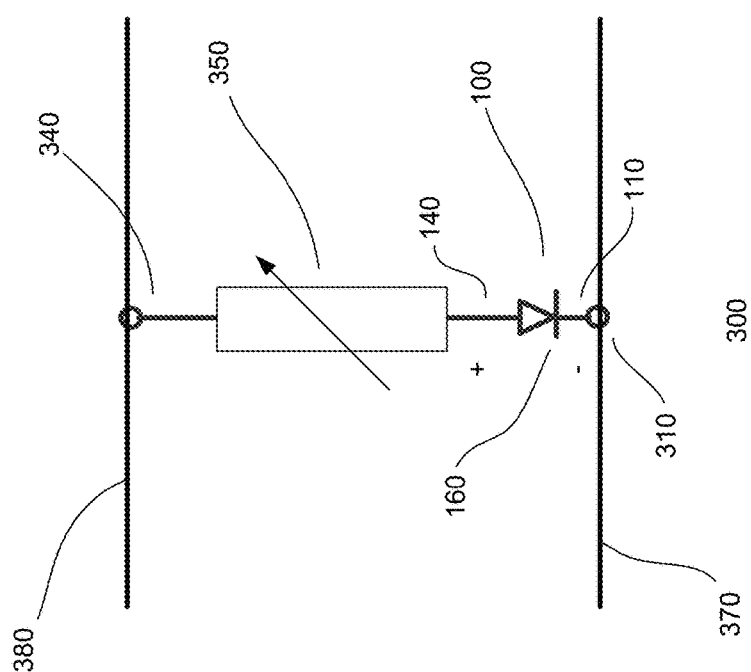
Fig. 3b
Fig. 3a

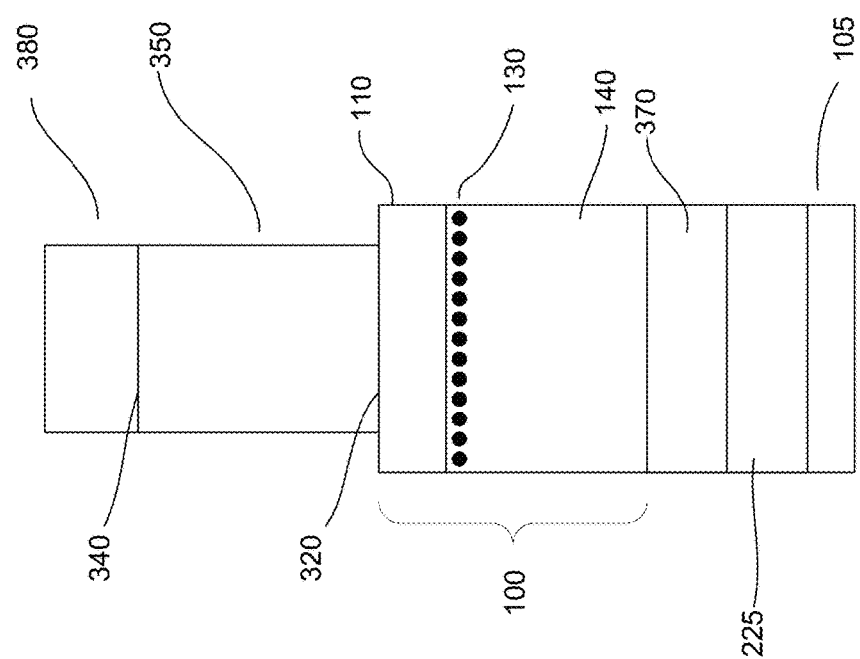
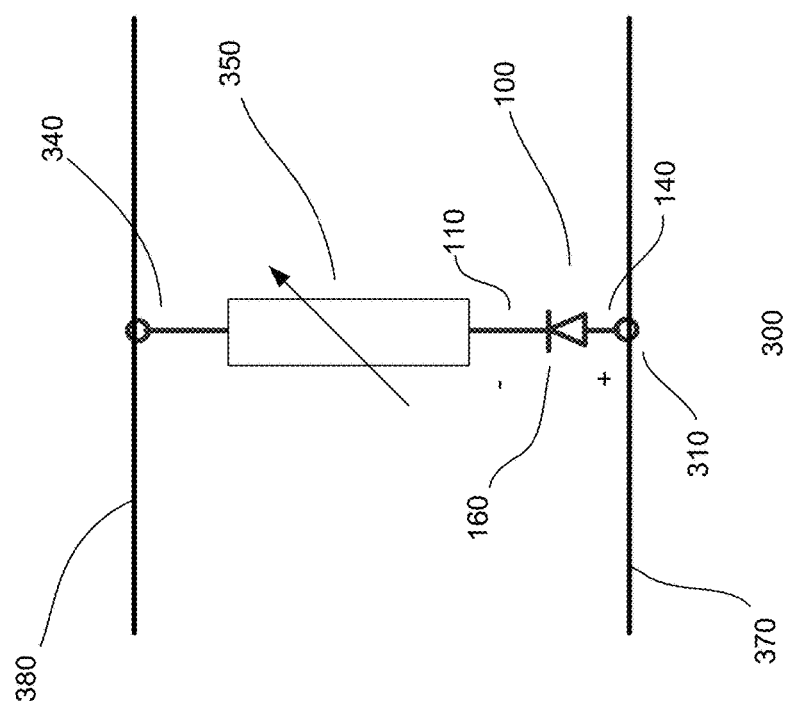
Fig. 4a
Fig. 4b

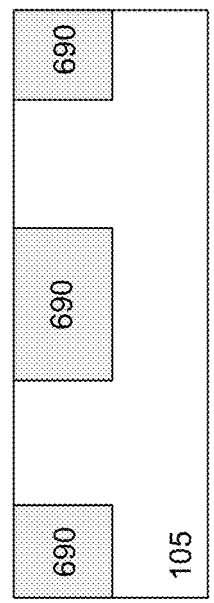
Fig. 7a$_2$
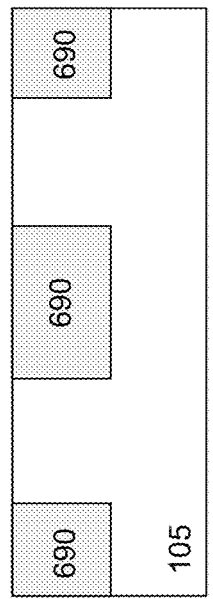
Fig. 7a$_1$

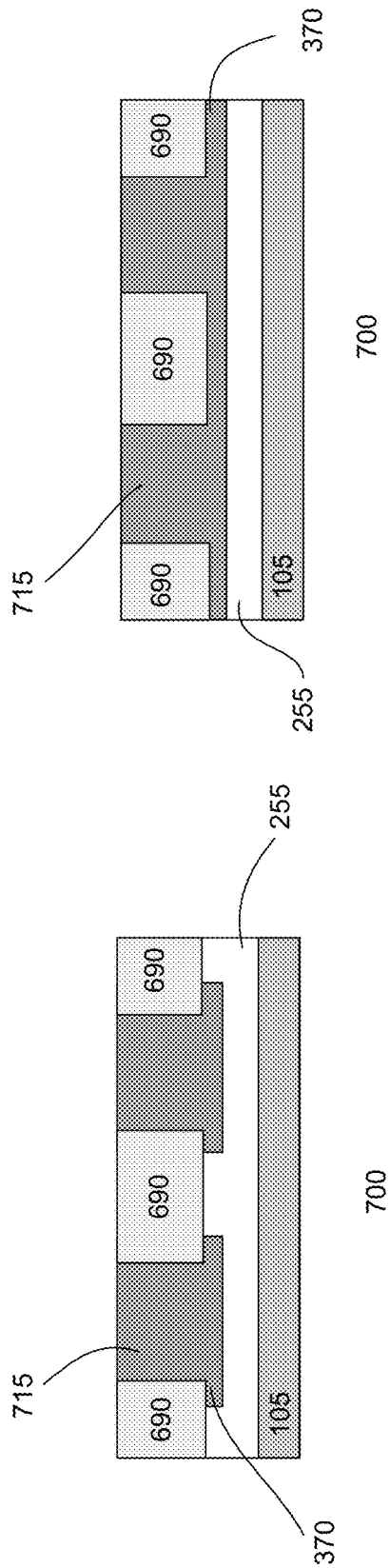

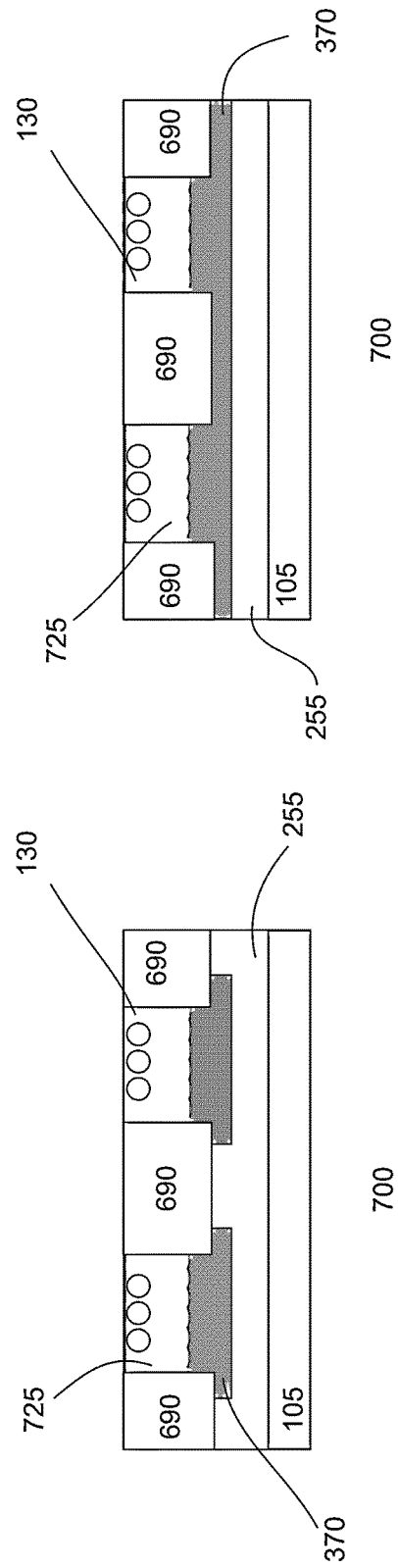

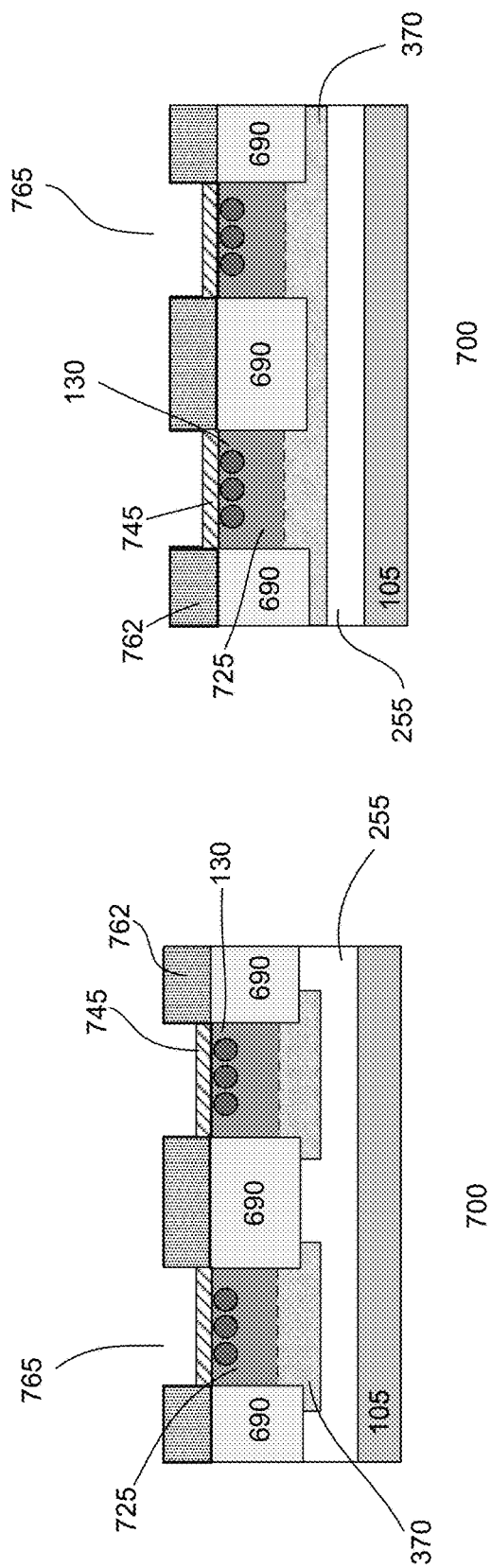
Fig. 7d₁
Fig. 7d₂

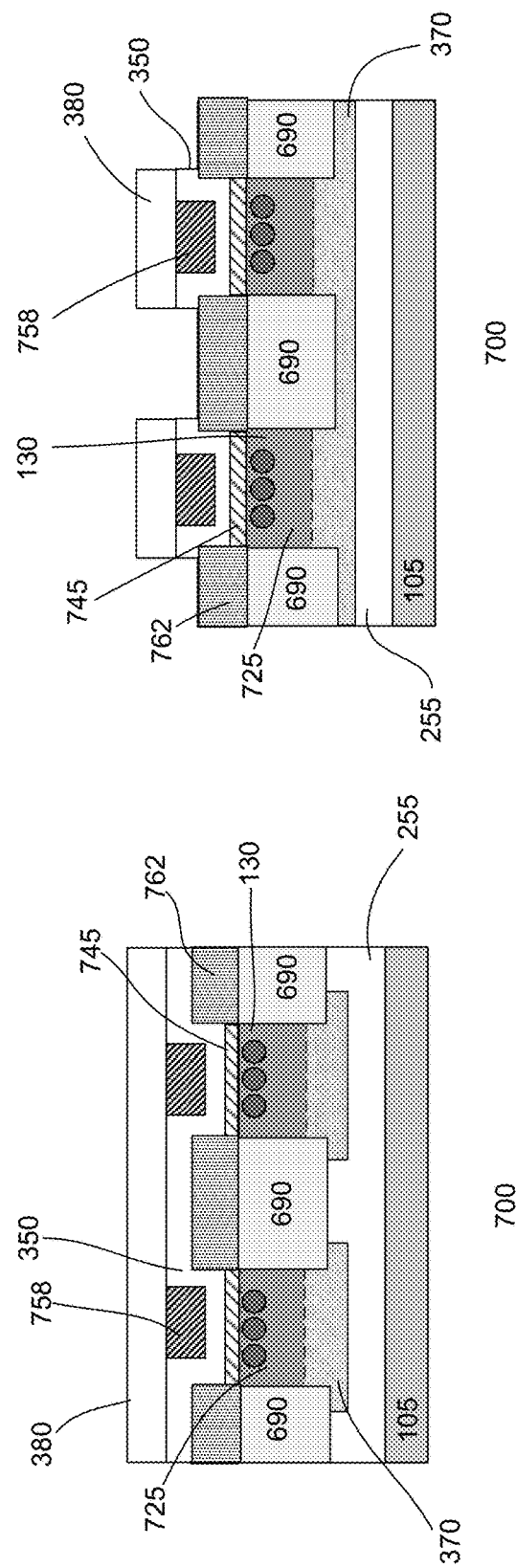

# HIGH RECTIFYING RATIO DIODE

BACKGROUND

Non-volatile memory (NVM) devices are widely used due to their advantages in various aspects, including device density, power consumption, programming/erasing speed, integration, etc. However, current NVM devices suffer serious cross-talk effect; require large cell area and facing scaling limitations. These factors negatively impact the performance of the memory devices.

From the foregoing discussion, it is desirable to provide improved device which eliminates the problem above. There is also a need to provide improved and scalable memory devices and simplified methods to form such devices.

SUMMARY

Embodiments generally relate to semiconductor devices. In one embodiment, a device is disclosed. The device includes a substrate and a selector diode disposed on a substrate. The diode includes first and second terminals. The first terminal is disposed between the second terminal and the substrate. The diode includes a Schottky Barrier (SB) disposed at about an interface of the first and second terminals. The SB includes a tunable SB height for a desired rectifying ratio defined by a SB region having segregated dopants. The device includes a memory element disposed over and coupled to the selector diode.

In another embodiment, a method for forming a device is disclosed. The method includes providing a substrate having isolation regions. A selector diode is formed on the substrate. The diode includes first and second terminals. The first terminal is formed between the second terminal and the substrate. A Schottky Barrier (SB) is formed at about an interface of the first and second terminals. The SB includes a tunable SB height (SBH) defined by a SB region having segregated dopants. A memory element is formed over the substrate and coupled to the selector diode.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2b show another embodiment of a high rectifying ratio diode;

FIGS. 3a-3b show an embodiment of a memory cell;

FIGS. 4a-4b show another embodiment of a memory cell;

Figure 6:
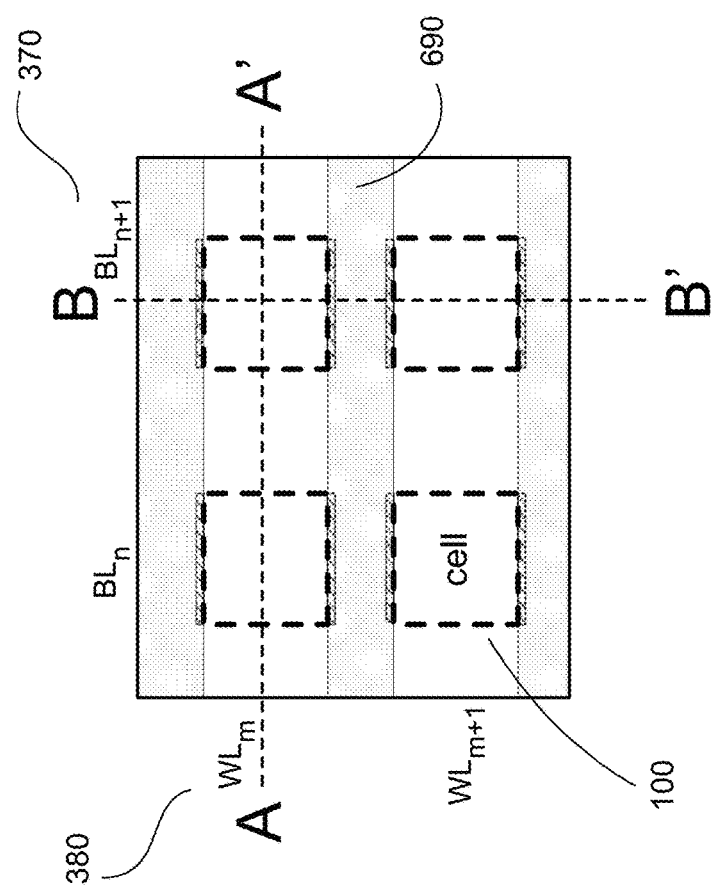
FIG. 6 shows a plan view of an embodiment of a memory array.

FIGS. $7a_1$-$7a_2$, $7b_1$-$7b_2$, $7c_1$-$7c_2$, $7d_1$-$7d_2$, $7e_1$-$7e_2$ show cross-sectional views of a process of forming a device; figures with subscript 1 indicates that the cross-sectional view is along A-A' and subscript 2 indicates that the cross-sectional view is along B-B' in FIG. 6.

DETAILED DESCRIPTION

Embodiments generally relate to semiconductor devices. Some embodiments relate to memory devices, such as NVM devices. More particularly, some embodiments relate to RRAM devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs).

Figure 1B:
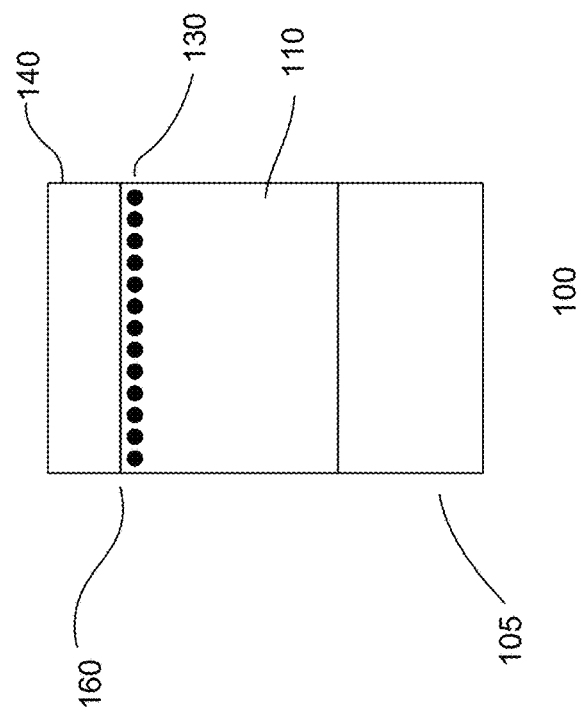
FIGS. 1a-1b show an embodiment of a high rectifying ratio diode.
Figure 1A:
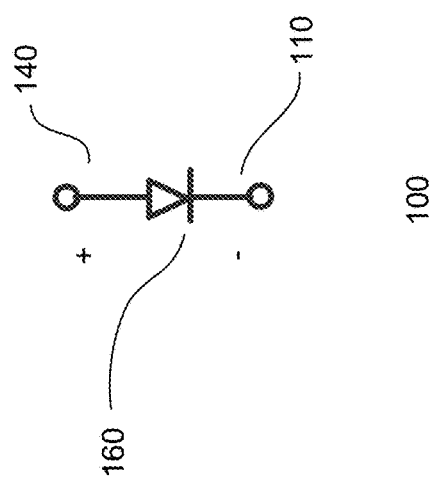

FIGS. 1a-1b and FIGS. 2a-2b show embodiments of a diode 100. FIG. 1a and FIG. 2a show circuit diagrams of embodiments of a diode 100 while FIG. 1b and FIG. 2b show cross-sectional views of the diode. Referring to FIGS. 1a-1b and FIGS. 2a-2b, the diode includes first and second terminal 110 and 140. As shown, the first terminal is a cathode (−) terminal while the second terminal is an anode (+) terminal.

The diode is formed on a substrate 105. The substrate is a semiconductor substrate. For example, the substrate is a silicon substrate. The substrate may be a lightly doped p-type substrate. Other types of semiconductor substrates, including crystalline-on-insulator (COI), such as silicon-on-insulator (SOI) substrates may also be useful. One of the diode terminals serves as a base or bottom terminal. The base terminal is disposed on or an integral part of the substrate. For example, the base terminal is a part of the substrate. Providing a base terminal which is not an integral part of the substrate, such as an epitaxial layer may also be useful. The base terminal may also be a combination of integral and non-integral parts of the substrate. Other configurations of the base terminal may also be useful.

In one embodiment, the base terminal is a doped region with first polarity type dopants. The base terminal is a heavily doped region. For example, the base terminal has a dopant concentration of about $1E20/cm^{-3}$. Other dopant concentration for the base terminal may also be useful. In the case where the base terminal serves as a cathode, the first polarity type is n-type, as shown by FIGS. 1a-1b. For example, the base terminal is a heavily doped n-type ($n^+$) region. On the other hand, if the base terminal is an anode terminal, as shown in FIGS. 2a-2b, the base terminal is a heavily doped p-type ($p^+$) region.

The other terminal of the diode is disposed on the base terminal. The other terminal, for example, serves as a non-base or top terminal of the diode. In one embodiment, the second terminal is a metal silicide layer disposed on the base terminal. The non-base terminal maybe a nickel silicide layer. Other types of metal silicides, including nickel-based silicides such as nickel platinum silicide, may also be useful to serve as the top terminal. The interface of the base and non-base terminal forms a Schottky barrier (SB) 160. For example, the SB is disposed at about the interface of the first and second diode terminals.

The first and second terminal includes a SB. A height of the SB (SBH), in one embodiment, is tunable. For example, the height of SBH can be tuned (increased or decreased) to the desired SBH. The SBH can be tuned to achieve the desired rectifying ratio. For example, the SBH results in the desired rectifying ratio. The SBH is directly related to the rectifying ratio. For example, the higher the SBH, the higher the rectifying ratio or the lower the SBH, the lower the rectifying ratio.

In one embodiment, a SB region 130 is provided for tuning the SBH. The SB region is disposed at the interface of the terminals. The SB region, in one embodiment, includes segregated dopants. For example, the segregated dopants result from dopants at the surface of the base terminal segregating when the metal silicide layer is formed. The depth of the SB region is, for example, less than the thickness of the semiconductor material of the base terminal being consumed during metal silicide formation. In one embodiment, the segregated dopants are different than the dopants in the base terminal. The segregated dopants facilitate in tuning the SBH. The dopant concentration of the SB region is about $1E20/cm^{-3}$. Other suitable dopant concentration may also be useful.

In one embodiment, the segregated dopants include liker dopants. Two types of liker dopants are available. The liker dopant types may include acceptor-liker and donor-liker types. Acceptor-liker type dopants are cations while donor-liker type dopants are anions. For example, acceptor-likers are positively charged ions while donor-likers are negatively charged ions. In one embodiment, an acceptor-liker type includes cations such as C, Al, In or a combination thereof; a donor-liker type includes anions such as F, S, Cl, Se or a combination thereof. Other types of acceptor-liker and donor-liker ions may also be useful.

In one embodiment, the first liker dopant type has a charge which is the same as that of the dopants of base terminal while the second liker dopant type has a charge which is the opposite of the dopants of the base terminal. As an example, if the base terminal includes n-type dopants, the first liker type includes anions while the second liker type includes cations. Alternatively, if the base terminal includes p-type dopants, the first liker type includes cations while the second liker type includes anions. In one embodiment, the first liker type decreases the SBH and the second liker type increases the SBH. The dopant concentration of liker dopants in the SB region is directly related to the impact on SBH. The higher the first liker dopant concentration, the greater the decrease in SBH; the higher the second liker dopant concentration, the greater the increase in SBH. The dopant concentration has an exponential effect.

The diode, in one embodiment, includes second liker type dopants to increase the SBH. In one embodiment, the second liker type dopants produce a high rectifying ratio diode. In one embodiment, the second liker type dopants produce a diode with at least a rectifying ratio of about greater than $10^6$. Tailoring the SBH for other rectifying ratios may also be useful. The dopant concentration of liker dopants in the SB region may be about $1E20/cm^{-3}$. Other dopant concentrations may also be useful.

In one embodiment, as shown in FIGS. 1a-1b, the base terminal is a cathode terminal. For example, the cathode terminal includes first polarity type dopants which are n-type dopants. The cathode terminal is a heavily doped n-type ($n^+$) region. To increase the SBH, second liker type dopants are provided in the SB region. In one embodiment, the second liker type dopants include cations. For example, the second liker type dopants include C, Al, In or a combination thereof. Other types of cations may also be useful. The SBH is tuned to achieve the desired rectifying ratio, such as greater than $10^6$. Tuning the SBH to achieve other desired rectifying ratios may also be useful. On the other hand, to decrease the SBH, first liker type dopants are provided in the SB region.

The first liker type dopants, in one embodiment, include anions. For example, the first liker type dopants include F, S, Cl, Se or a combination thereof. Other types of anions may also be useful. The SBH is tuned to achieve the desired rectifying ratio.

In one embodiment, as shown in FIGS. 2a-2b, the base terminal is an anode terminal. For example, the anode terminal includes first polarity type dopants which are p-type dopants. The anode terminal is a heavily doped p-type ($p^+$) region. To increase the SBH, second liker type dopants are provided in the SB region. In one embodiment, the second liker type dopants include anions. For example, the second liker type dopants include F, S, Cl, Se or a combination thereof. Other types of anions may also be useful. The SBH is tuned to achieve the desired rectifying ratio, such as greater than $10^6$. Tuning the SBH to achieve other desired ratifying ratios may also be useful. On the other hand, to decrease the SBH, first liker type dopants are provided in the SB region. The first liker type dopants, in one embodiment, include cations. For example, the first liker type dopants include C, Al, In or a combination thereof. Other types of cations may also be useful. The SBH is tuned to achieve the desired rectifying ratio.

In the case that the substrate has the same doping type as the base terminal, an isolation well 225 is provided. For example, if the substrate is a p-type substrate and the base terminal is a p-type doped region, an isolation well is provided to isolate the diode from the substrate. The isolation well, in one embodiment, is doped with dopants of the opposite polarity of that in the base terminal. For example, the isolation well is doped with second polarity type dopants. For example, the isolation well is a n-type doped well to isolate the p-type base terminal from the p-type substrate. The isolation well may be lightly or intermediately doped with second polarity type dopants. On the other hand, if the base terminal is oppositely doped than that of the substrate, no isolation well is needed.

As described, the diode can be tuned to the desired rectifying ratio. The diode can be tuned to have a high rectifying ratio of, for example, greater than $10^6$. The high rectifying ratio diode can be used as, for example, a selector for a memory cell. The diode may be implemented in a cross-point type of memory configuration.

FIGS. 3a-3b and FIGS. 4a-4b show embodiments of a memory cell 300. FIG. 3a and FIG. 4a show circuit diagrams of embodiments of a memory cell while FIG. 3b and FIG. 4b show cross-sectional views of the memory cell. The memory cell is a random access memory (RAM) cell. The memory cell, in one embodiment, is a non-volatile (NV) RAM cell. Other types of non-volatile memory cell may also be useful. Referring to FIGS. 3a-3b and FIGS. 4a-4b, the memory cell includes a diode 100. The diode is similar to that described in FIGS. 1a-1b and FIGS. 2a-2b. Common elements may not be described or described in detail.

The memory cell includes a diode 100 coupled to a memory element 350. The diode serves as a cell selector and the memory element serves as a storage element of the memory cell. The diode, for example, includes first and second terminal 110 and 140. As shown, the first terminal is a cathode (−) terminal while the second terminal is an anode (+) terminal. One of the diode terminals serve as a first cell terminal 310 while the other diode terminal is a non-cell terminal. The diode includes a SB at the interface of the terminals. The SB has a tunable SBH, facilitated by liker dopants in the SB region 130 disposed at the interface of the terminals. The SBH is tuned to achieve the desired rectifying ratio. In one embodiment, the SBH is tuned to achieve a high rectifying ratio, such as greater than $10^6$. Tuning the SBH to achieve other rectifying ratios may also be useful. For example, the SB region includes second liker type dopants to increase the SBH. The concentration should be sufficient to achieve the desired SBH. The concentration of liker dopants in the SB region may be about $1E20/cm^{-3}$. Other dopant concentrations may also be useful.

The diode is formed on a substrate 105. One of the diode terminals serves as a base or bottom terminal. The base terminal is disposed on or an integral part of the substrate. For example, the base terminal is a part of the substrate. Providing a base terminal which is not an integral part of the substrate, such as an epitaxial layer may also be useful. The base terminal may also be a combination of integral and non-integral parts of the substrate. Other configurations of the base terminal may also be useful. In one embodiment, the base terminal serves as the first cell terminal. The base terminal is heavily doped with first polarity type dopants. The non-base terminal is disposed on the base terminal. The non-base terminal serves as a non-cell terminal of the diode. The interface of the terminal forms the SB 160. A SB region 130 with liker dopants is disposed at the interface of the terminals for tuning the SBH.

As for the memory element, it includes first and second memory terminals 320 and 340. In one embodiment, the first memory terminal is coupled to the non-cell terminal of the diode while the second memory terminal serves as a second cell terminal. The memory element is disposed on the top or non-base terminal of the diode. For example, the first memory terminal is disposed on the non-base terminal of the diode.

In one embodiment, the memory element is a resistive memory element, forming a resistive RAM (RRAM) cell. For example, the resistive element includes a programmable resistive element. The programmable resistive element can be in a first or second resistive state. In one embodiment, the first state is a high resistive state and the second state is a low resistive state. One of the resistive states represents a logic "0" while the other represents a logic "1". For example, the high resistive state may represent a logic 0 while the low resistive state may represent a logic 1. Having the high resistive state representing a logic 1 and the low resistive state representing a logic 0 may also be useful. Other configurations of data storage for the RRAM cell may also be useful.

In one embodiment, the programmable resistive element includes programmable resistive stack. The programmable resistive stack, for example, includes a programmable resistive layer and an electrode layer. The resistive layer, for example, may be a transitional metal oxide, such as titanium oxide (TiOx), nickel oxide (NiOx), aluminum oxide (AlOx), hafnium oxide (HfOx), tungsten oxide (WOx), tantalum oxide (TaOx), vanadium oxide (VOx), or copper oxide (CuOx). Other types of programmable resistive layers may also be useful. A programmable resistive layer is subjected to a forming procedure which creates conduction paths or filaments after it is formed. The filaments can be reset or broken by subjecting the programmable resistive material to a reset procedure or condition; the filaments can be set or re-formed by subjecting the programmable resistive layer to a set procedure or condition. Once set or reset, the state of the resistor is stable until reset or set. A resistor with broken filaments is in a high resistive state while a reset resistor with re-formed filaments is in a low resistive state. The electrode layer, for example, may be a platinum electrode layer. Other types of electrode layers may also be useful. In one embodiment, the electrode layer may be disposed over the resistive layer. The electrode layer, for example may serve as the second memory terminal. Other configurations of resistive stack may also be useful.

Although the memory element is described as a resistive memory element. Other types of memory elements may also be useful. For example, the memory element may be any types of memory element used in storing data, such as but are not limited to PCRAM, FeRAM and MRAM.

A first conductor 370 is disposed below the base terminal. The first conductor is disposed along a first direction. In one embodiment, the first conductor is a buried conductor. For example, the first conductor is a heavily doped region in the substrate in communication with the base terminal (first cell terminal). The first conductor may be heavily doped with a dopant concentration of about $1E20/cm^{-3}$. Other dopant concentrations may also be useful. In one embodiment, the first conductor is a heavily doped region with first polarity type dopants. The first conductor includes the same polarity type dopants as the base terminal of the diode. For example, the first conductor is a n+ doped region for a n+ base terminal while the first conductor is a p+ doped region for a p+ base terminal. Other suitable types of first conductors may also be useful. For example, the first conductor may be a metal conductor.

A second conductor 380 is disposed over the memory element. The second conductor 380 is disposed in a second direction. The first and second directions, for example, are orthogonal to each other. In one embodiment, the second conductor 380 is disposed on the memory element. For example, the second conductor is disposed on the electrode of the memory stack. The second conductor may be in direct communication with the memory element. In other embodiments, the second conductor may be in indirect communication with the memory element. For example, a conductive plug, such as a tungsten plug, may be provided to connect the second conductor to the memory element. The second conductor, in one embodiment, is a metal conductor. For example, the second conductor is a copper conductor. Other suitable types of conductors may also be useful. The first conductor, for example, may be a bitline (BL) conductor and the second conductor may be a wordline (WL) conductor. Alternatively, the first conductor may be a WL conductor and the second conductor may be a BL conductor.

As shown in FIGS. 3a-3b, the base terminal of the diode is a cathode terminal. For example, the base terminal is heavily doped with n-type ($n^+$) dopants. As for the non-base terminal of the diode, it is the anode terminal. As such, the memory element is connected to the anode terminal of the diode. Alternatively, as shown in FIGS. 4a-4b, the base terminal of the diode is an anode terminal. For example, the base terminal is heavily doped with p-type ($p^+$) dopants. As for the non-base terminal of the diode, it is the cathode terminal. As such, the memory element is connected to the cathode terminal of the diode.

In the case that the substrate has the same doping type as the base terminal and first conductor, an isolation well 225 is provided. For example, if the substrate is a p-type substrate and the base terminal is a p-type doped region, an isolation well is provided to isolate the diode and first conductor from the substrate. The isolation well, in one embodiment, is doped with dopants of the opposite polarity of that in the base terminal. For example, the isolation well is doped with second polarity type dopants. For example, the isolation well is a n-type doped well to isolate the p-type base terminal from the p-type substrate. The isolation well may be lightly or intermediately doped with second polarity type dopants. On the other hand, if the base terminal and first conductor are oppositely doped to that of the substrate, no isolation well is needed.

A plurality of memory cells may be interconnected by WLs and BLs to form an array. In one embodiment, the array is a cross-point memory cell array. For example, a memory cell is disposed at the crossing points of the first and second conductors. For example, the memory array includes a cross-point memory cell array of 1D1R cells. Through the use of high rectifying ratio diode as a select element, high forward current density is achieved. Furthermore, the cell, by stacking memory element on the diode, results in a small cell area. For example, the cell has a size of about $4F^2$.

Figure 5:
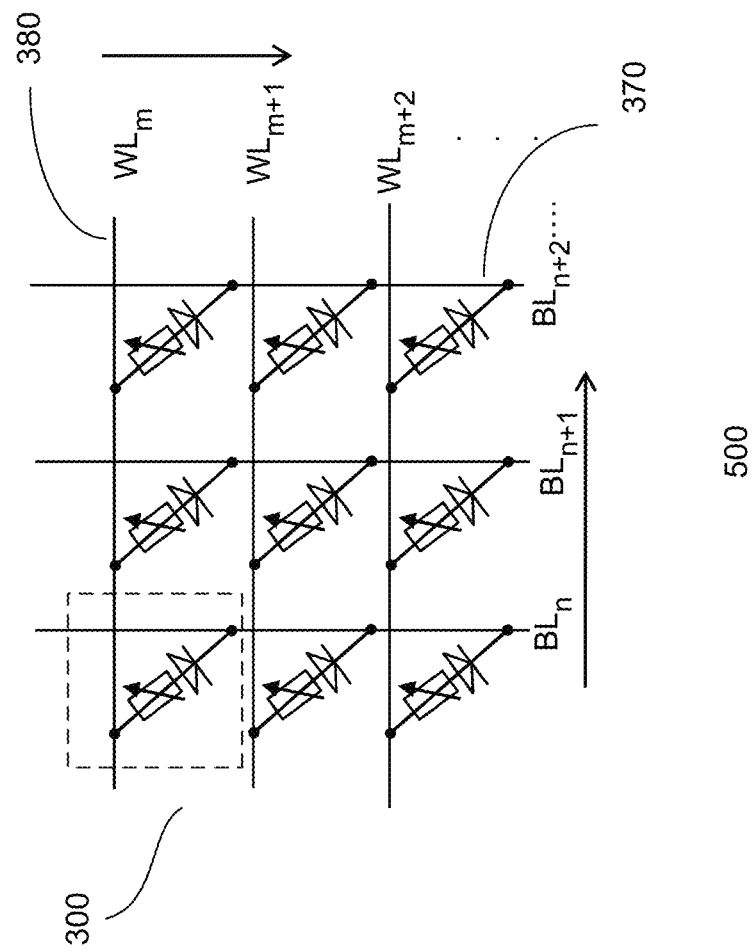
FIG. 5 shows a schematic diagram of an embodiment of a memory array.

FIG. 5 shows a schematic diagram of an embodiment of a memory array 500. The memory cells are similar to those described in, for example, FIGS. 3a-3b and FIGS. 4a-4b. Common elements may not be described or described in detail. The array includes a plurality of memory cells 300 interconnected by WLs 380 and BLs 370. As shown, a portion of the array includes $WL_m$, $WL_{m+1}$ and $WL_{m+2}$ and $BL_n$, $BL_{n+1}$ and $BL_{n+2}$. It is understood that an array may include more WLs and BLs. Memory cells are disposed at the intersections of the WLs and BLs. In one embodiment, a base terminal of the diode is coupled to the BL while an electrode of the memory element is coupled to the WL. Alternatively, the base terminal of the diode is coupled to the WL while the electrode of the memory element is coupled to the BL. As shown, the base terminal is a cathode terminal of the diode. Providing the base terminal which is an anode terminal may also be useful. Other array configurations may also be useful.

FIG. 6 shows a plan view of a layout of an embodiment of a memory array 600. The array includes a plurality of memory cells interconnected by WLs 380 and BLs 370. As shown, a portion of the array includes $WL_m$ and $WL_{m+1}$ in the wordline direction and $BL_n$ and $BL_{n+1}$ in the bitline direction interconnecting four memory cells. It is understood that an array may include more WLs and BLs. Memory cells are disposed at the intersections of the WLs and BLs. Each memory cell is disposed on a selector diode 100. Separating adjacent diodes are isolation regions 690 in both column and row directions.

FIGS. 7a-7e show cross-sectional views of a process of forming a device 700. The device corresponds to the cross-sectional view of the layout in FIG. 6. The layout includes memory cells as described in FIGS. 3a-3b and FIGS. 4a-4b, which include diodes as described in FIGS. 1a-1b and FIGS. 2a-2b. Common elements may not be described or described in detail. Subscript 1 indicates that the cross-sectional view is along A-A' (first direction) and subscript 2 indicates that the cross-sectional view is along B-B' (second direction) in FIG. 6. The first and second directions are orthogonal to each other. In one embodiment, A-A' is along a WL direction while B-B' is along the BL direction. Providing A-A' along the BL direction and B-B' in the WL direction may also be useful.

Referring to FIGS. $7a_1$-$7a_2$, a substrate 105 is provided. The substrate is a semiconductor substrate. For example, the substrate is a silicon substrate. The substrate may be a lightly doped p-type substrate. Other types of semiconductor substrates, including crystalline-on-insulator (COI), such as silicon-on-insulator (SOI) substrates, may also be useful.

The substrate is prepared with isolation regions 690. The isolation regions, in one embodiment, are shallow trench isolation (STI) regions. The STI regions, for example, may have a depth of about 300 nm and a width of about 80 nm. Other suitable dimensions for the STI regions as well as other suitable types of isolation regions may also be useful. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STI.

The isolation region, in one embodiment, defines individual selector diode regions of the memory array. For example, an isolation region surrounds a selector diode. The substrate surface surrounded by the isolation region defines the active area of the selector diode. The active surface of the selector diode area is about 1F×1F.

In FIGS. $7b_1$-$7b_2$, first wells 715 are formed in the substrate. The first wells include first polarity type dopants. In one embodiment, the first wells are from the substrate surface to a depth greater than the bottom of the isolation regions. The first wells may be formed by ion implantation with peak concentration of about $1E20/cm^{-3}$ below the bottom of the isolation regions. Other dopant concentrations may also be useful. In one embodiment, the portion of the first wells below the isolation regions form first conductors 370 along the second direction. An implant mask may be used to facilitate forming the first wells and first conductors. A patterned photoresist may be used as the implant mask. The implant mask, for example, is a conductor implant mask having the pattern of the conductors.

An isolation well 255 may be provided. For example, in the case that the first polarity is the same as the doped substrate, an isolation well is provided. The isolation well, in one embodiment, include second polarity type dopants. For example, second polarity type dopants are implanted into the substrate. An isolation well implant mask may be used. The isolation well implant mask may be the same mask used to form second polarity type isolation wells in conventional CMOS processes. The isolation well may be lightly or intermediately doped with second polarity type dopants. If an isolation well is provided, it is formed prior to forming the first wells and first conductors.

For example, in the case of a lightly doped p-type ($p^-$) substrate and the first polarity type is p-type, then an isolation well is provided. On the other hand, if the substrate is a p-type substrate and the first polarity type is n-type, no isolation well is provided.

As shown in FIGS. $7c_1$-$7c_2$, base terminals 725 of the diodes are formed in the selector diode regions defined by the isolation regions. The base terminals, in one embodiment, are heavily doped regions with first polarity type dopants. For example, the base terminal has a dopant concentration of about $1E20/cm^{-3}$. Other dopant concentrations may also be useful. The base terminals may be formed by implanting first polarity type dopants. The base terminal implant, for example, may be performed at the same time as source and drains of first polarity type transistors in the logic region of the device. Alternatively, the base terminal may be implanted at the same time as the first wells. An implant mask which protects second polarity type transistors may be used. For example, a first polarity type source and drain mask may be used. The base terminal has a depth shallower than the isolation regions, as indicated by the dotted line. This ensures that the base terminals are individual base terminals. For example, individual base terminals are connected by BLs. An anneal may be performed to activate the first polarity type dopants. This anneal can be shared with the activation of source and drain dopants of transistors in the logic region of the device.

A SB region 130 is formed. The SB region is formed after, for example, forming the base terminal. This, for example, may be after the activation of the dopants in the base terminal. In one embodiment, second type liker dopants are implanted on the surface of the active cell regions to form the SB region. A SB mask, such as photoresist, may be used as an implant mask to form the SB region. The second type liker dopants are used to increase the SBH of the selector diodes of the memory cells. For example, in the case where the first polarity type is n-type, the second type liker dopants are acceptor-liker dopants. On the other hand, if the first polarity is p-type, the second type liker dopants are donor-liker dopants. The dopant concentration of the liker dopants for the SB region is about $1E20/cm^{-3}$. Other dopant concentrations may also be useful. The doping concentration of the SB region is tailored to achieve a high rectifying ratio. For example, the SB region is tailored to achieve a rectifying ratio of greater than $10^6$. Other rectifying ratios may also be useful. The depth of the SB region is, for example, less than the thickness of the semiconductor material of the base terminal being consumed during metal silicide formation later.

Referring to FIGS. $7d_1$-$7d_2$, a dielectric layer 762 is formed on the substrate. The dielectric layer, for example, covers the substrate and isolation regions. The dielectric layer, for example, serves as an inter-level dielectric (ILD) layer. The dielectric layer, for example, is a silicon oxide layer. The dielectric layer may be formed by, for example, CVD. Other techniques for forming the dielectric layer may also be useful. In one embodiment, the thickness of the dielectric layer is equal to about 3000 A. Other suitable thicknesses may also be useful.

The dielectric layer is patterned to form via openings 765. The via openings should be aligned with the base terminal. The contact opening exposes the top of the base terminal with the SB region. To form the via openings, mask and etch techniques may be employed. Non-base or top diode terminals are formed on the exposed substrate surface. For example, the top terminals are formed on the SB regions of the diodes. In one embodiment, the top terminals 745 are metal silicide layers. In one embodiment, the metal silicide layer is a NiPt silicide layer. Other types of metal silicide layers may also be useful. In one embodiment, Ni/Pt/TiN layer is formed on the substrate, covering the dielectric layer and lining the via openings. An anneal is performed, causing the exposed portions of the substrate to react to form NiPt silicide terminals. Unreacted NiPtTiN on the dielectric layer are removed by, for example, a wet etch, leaving top terminals over the base terminals at the bottom of the via openings. The formation of the silicide layer causes the second type liker dopants to segregate at the interface of the substrate and silicide interface. The formation of the top terminal can also form silicide contacts of transistors in the logic region of the device. The top terminal, for example, also serves as a first memory terminal of a memory element.

In one embodiment, a base terminal of the diode is coupled to the BL while an electrode of the memory element is coupled to the WL. Alternatively, the base terminal of the diode is coupled to the WL while the electrode of the memory element is coupled to the BL. As shown, the base terminal is an anode terminal of the diode. Providing the base terminal which is a cathode terminal may also be useful. Other array configurations may also be useful.

In FIG. $7e_1$-$7e_2$, the process continues to form memory elements 350 on the top diode terminal. In one embodiment, the memory elements are resistive memory elements, forming RRAM cells. The various layers of the memory stack are deposited on the substrate. For example, a programmable resistive layer is formed on the substrate followed by a top electrode layer. The resistive layer, for example, may be a transitional metal oxide, such as titanium oxide (TiOx), nickel oxide (NiOx), aluminum oxide (AlOx), hafnium oxide (HfOx), tungsten oxide (WOx), tantalum oxide (TaOx), vanadium oxide (VOx), or copper oxide (CuOx). Other types of programmable resistive layers may also be useful. The top electrode layer, for example, may be a platinum layer. Other types of top electrode layers may also be useful. The memory stack layers line the surface of the dielectric layer and via openings. Various techniques, such as CVD, may be used to form the layers of the memory stack. Other techniques may also be useful.

A plug layer is formed on the substrate. The plug layer, for example, is a tungsten layer. Other types of plug layers may also be useful. The plug layer serves to connect WL to the top electrode of the memory stack. The plug layer, for example, subjects the underlying resistive layer to a forming procedure which creates conduction paths or filaments. In one embodiment, the plug layer fills the via opening and covers the memory stack layer over the dielectric layer. Excess plug material may be removed by, for example, chemical mechanical polishing (CMP). This forms the plugs 758 in the via opening, as shown.

Second conductors 380 are formed on the substrate along the first direction. To form the second conductors, a conductor layer is formed on the substrate. The conductor layer, for example, is a metal layer, such as copper. Techniques such as sputtering may be used to form the conductor layer. Other techniques may also be used. The conductor layer is patterned to form second conductors. In one embodiment, the conductor layer and memory stack are patterned together. For example, a second conductor mask layer is used to pattern the conductor and memory stack layers by RIE. The process continues to complete the device. For example, the process may continue to form additional interconnect levels, passivation, dicing and packaging.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
    a substrate having isolation regions;
    a selector diode disposed on the substrate, wherein the diode comprises
        first and second diode terminals which are in direct contact with each other, the first diode terminal is disposed between the second diode terminal and the substrate, wherein the first diode terminal comprises a semiconductor material and the second diode terminal comprises a metal silicide layer, and
        a Schottky Barrier (SB) disposed at about an interface of the first and second terminals, wherein the SB comprises a tunable SB height (SBH) between the metal silicide layer of the second terminal and the semiconductor material of the first terminal which are in direct contact with each other for a desired rectifying ratio defined by a SB region having segregated dopants, wherein the segregated dopants include a dopant type which increases the SBH;
a first conductor disposed in the substrate and directly below the first diode terminal, wherein the first conductor includes a doped region extending to a depth greater than a bottom of the isolation regions; and
a memory element disposed over the selector diode, wherein the memory element is directly coupled to the second diode terminal.

2. The device of claim 1 wherein the first diode terminal and the first conductor are defined by heavily doped regions having first polarity type dopants.

3. The device of claim 2 wherein:
the segregated dopants comprise liker type dopants, wherein the liker type dopants include a charge which is opposite to a charge of the first polarity type dopants of the first diode terminal; and
wherein the tunable SBH is increased by increasing a concentration of the liker type dopants.

4. The device of claim 3 wherein:
the first polarity type dopants are n-type;
the first diode terminal is a cathode terminal; and
the second diode terminal is an anode terminal.

5. The device of claim 4 wherein the concentration of the liker type dopants increases the SBH from an initial rectifying ratio to produce a final rectifying ratio greater than $10^6$.

6. The device of claim 4 wherein the second liker type dopants comprise C, Al, In or a combination thereof.

7. The device of claim 3 wherein:
the first polarity type dopants are p-type;
the first diode terminal is an anode terminal; and
the second diode terminal is a cathode terminal.

8. The device of claim 7 wherein the concentration of the liker type dopants produces a rectifying ratio greater than $10^6$.

9. The device of claim 7 wherein the liker type dopants comprise F, S, Cl, Se or a combination thereof.

10. The device of claim 2 comprising:
an isolation well having second polarity type dopants disposed in between the substrate and the first diode terminal.

11. The device of claim 1 wherein the memory element comprises a resistive random access memory (RRAM).

12. The device in claim 1 further comprising:
a second conductor, wherein the second conductor is a metal layer disposed over the memory element; and
a conductor plug which couples the second conductor to the memory element.

13. A device comprising:
a substrate;
a selector diode disposed on the substrate, wherein the diode comprises
first and second diode terminals which are in direct contact with each other, the first diode terminal is disposed between the second diode terminal and the substrate, wherein the first diode terminal comprises a semiconductor material heavily doped with first polarity type dopants and the second diode terminal comprises a metal silicide layer, and
a Schottky Barrier (SB) disposed at about an interface of the first and second terminals, wherein the SB comprises a tunable SB height (SBH) between the metal silicide layer of the second diode terminal and the semiconductor material of the first diode terminal which are in direct contact with each other for a desired rectifying ratio defined by a SB region having segregated dopants, wherein the SB region comprises a concentration of second liker type dopants, and wherein the second liker type dopant has a charge which is opposite of the dopants of the first diode terminal which increases the SBH to achieve the desired rectifying ratio; and
an isolation well disposed between the substrate and the first diode terminal, wherein the isolation well includes second polarity type dopants and the first diode terminal includes first polarity type dopants opposite to the second polarity type.

14. The device of claim 13 comprising a memory element disposed over and coupled to the selector diode, wherein the memory element comprises a programmable resistive layer which is in direct contact with the metal silicide layer.

15. The device of claim 14 comprising first and second conductors, wherein the first conductor is disposed in the substrate directly below the first diode terminal, wherein the second conductor is disposed over the substrate and in communication with the memory element.

16. A device comprising:
a substrate having isolation regions;
a selector diode disposed on the substrate, wherein the diode comprises first and second terminals which are in direct contact with each other, wherein
the first diode terminal is disposed between the second diode terminal and the substrate, the first diode terminal comprises a semiconductor material heavily doped with first polarity type dopants disposed within the substrate,
the second diode terminal comprises a metal silicide layer disposed on a top substrate surface, and
a Schottky Barrier (SB) is disposed at about an interface of the first and second diode terminals, wherein the SB comprises a tunable SB height (SBH) between the metal silicide layer of the second terminal and the semiconductor material of the first terminal which are in direct contact with each other for a desired rectifying ratio defined by a SB region having segregated dopants;
a memory element disposed over and coupled to the selector diode; and
first and second conductors, wherein the first conductor is a buried first well disposed in the substrate having a depth greater than a bottom of the isolation regions and is disposed below the first diode terminal and the second conductor is a conductor layer disposed over the memory element.

17. The device of claim 16 wherein:
the segregated dopants comprise a first or second liker dopant type, wherein the first liker dopant type has a charge which is the same as that of the dopants of the first diode terminal and the second liker dopant type has a charge which is opposite of the dopants of the first diode terminal; and
the first liker dopant type decreases the SBH and the second liker dopant type increases the SBH.

18. The device of claim 17 wherein:
the first polarity type dopants are n-type;
the first diode terminal is a cathode terminal; and
the second diode terminal is an anode terminal.

19. The device of claim 17 wherein:
the first polarity type dopants are p-type;
the first diode terminal is an anode terminal; and
the second diode terminal is a cathode terminal.

20. The device of claim 19 comprising an isolation well disposed between the first diode terminal and the substrate, wherein the isolation well includes opposite polarity type dopants from the first diode terminal.

21. The device of claim 16 wherein the SB region comprises a concentration of second liker type dopants, and wherein the second liker type dopant has a charge which is opposite of the dopants of the first terminal which increases the SBH to achieve the desired rectifying ratio.

22. The device of claim 21 comprising a conductor plug which couples the second conductor to the memory element.

* * * * *